(12) United States Patent
Chang (10) Patent No.: US 11,269,434 B2
(45) Date of Patent: Mar. 8, 2022

(54) TOUCH STRUCTURE, MANUFACTURING METHOD THEREOF, AND TOUCH DISPLAY DEVICE

(71) Applicant: E Ink Holdings Inc., Hsinchu (TW)

(72) Inventor: Chien-Hsing Chang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/881,009

(22) Filed: May 22, 2020

(65) Prior Publication Data

US 2020/0371628 A1 Nov. 26, 2020

(30) Foreign Application Priority Data

May 23, 2019 (TW) .................. 108117776

(51) Int. Cl.
*G06F 3/041* (2006.01)
*H05K 9/00* (2006.01)
*H05K 1/18* (2006.01)

(52) U.S. Cl.
CPC .......... *G06F 3/0412* (2013.01); *H05K 1/189* (2013.01); *H05K 9/0084* (2013.01); *G06F 2203/04102* (2013.01); *G06F 2203/04103* (2013.01); *G06F 2203/04107* (2013.01); *H05K 2201/10128* (2013.01)

(58) Field of Classification Search
CPC ......... G06F 3/0412; G06F 2203/04103; G06F 2203/04102; G06F 2203/04107; H05K 9/0084; H05K 1/189; H05K 2201/10128; H05K 2201/0145; H05K 2201/083; H05K 2201/10151; H05K 2201/0723; H05K 3/0052; H05K 3/007; H05K 1/0216; H05K 2201/0154; H05K 1/147
See application file for complete search history.

(56) References Cited

U.S. PATENT DOCUMENTS

| | | | |
|---|---|---|---|
| 8,035,927 B2 | 10/2011 | Boone, Jr. et al. | |
| 8,059,373 B2 * | 11/2011 | Folks | G11B 5/3993 360/324 |
| 8,166,633 B2 | 5/2012 | Boone, Jr. et al. | |
| 9,164,153 B2 | 10/2015 | Kosel et al. | |
| 9,395,857 B2 * | 7/2016 | Wu | G06F 3/0412 |
| 9,756,733 B2 * | 9/2017 | Drzaic | G09G 3/20 |
| 2010/0265206 A1 * | 10/2010 | Chen | G06F 3/0445 345/174 |

(Continued)

FOREIGN PATENT DOCUMENTS

TW I471086 1/2015

*Primary Examiner* — Grant Sitta
(74) *Attorney, Agent, or Firm* — JCIPRNET (57) ABSTRACT

A touch structure including an insulating substrate, an electromagnetic shielding structure layer, a sensing circuit structure layer, a first insulating layer, and a second insulating layer is provided. The electromagnetic shielding structure layer is disposed on the insulating substrate, and located between the insulating substrate and the sensing circuit structure layer. The sensing circuit structure layer is disposed on the insulating substrate, and includes a first sensing circuit layer and a second sensing circuit layer. The first insulating layer is disposed between the electromagnetic shielding structure layer and the first sensing circuit layer. The second insulating layer is disposed between the first sensing circuit layer and the second sensing circuit layer.

6 Claims, 5 Drawing Sheets

(56) References Cited

U.S. PATENT DOCUMENTS

| | | | |
|---|---|---|---|
| 2010/0294559 A1* | 11/2010 | Izawa | H05K 9/0024 174/378 |
| 2013/0120846 A1* | 5/2013 | Dai | H01B 1/16 359/601 |
| 2013/0143065 A1* | 6/2013 | Cao | H05K 9/0084 428/624 |
| 2013/0162595 A1* | 6/2013 | Lee | G06F 3/0445 345/174 |
| 2013/0240261 A1* | 9/2013 | Song | H05K 9/0075 174/391 |
| 2014/0145979 A1* | 5/2014 | Lee | H01L 51/5281 345/173 |
| 2014/0267951 A1 | 9/2014 | Lee et al. | |
| 2015/0268783 A1* | 9/2015 | Yoon | G06F 3/0445 345/173 |
| 2016/0106012 A1* | 4/2016 | Jang | G06F 1/1656 361/679.26 |
| 2016/0246415 A1* | 8/2016 | Bae | G06F 3/0445 |
| 2016/0286698 A1* | 9/2016 | Chang | B32B 27/26 |
| 2017/0045978 A1* | 2/2017 | Xu | G06F 3/0412 |
| 2017/0060308 A1 | 3/2017 | Hong et al. | |
| 2018/0246388 A1* | 8/2018 | Lo | G02F 1/13454 |
| 2019/0278411 A1* | 9/2019 | Jeon | G02B 5/3025 |
| 2020/0371628 A1* | 11/2020 | Chang | H05K 3/0052 |

* cited by examiner

TOUCH STRUCTURE, MANUFACTURING METHOD THEREOF, AND TOUCH DISPLAY DEVICE

CROSS-REFERENCE TO RELATED APPLICATION

This application claims the priority benefit of Taiwan application serial no. 108117776, filed on May 23, 2019. The entirety of the above-mentioned patent application is hereby incorporated by reference herein and made a part of this specification.

BACKGROUND

Technical Field

The disclosure relates to a semiconductor device, and more particularly to a touch structure, a manufacturing method of the touch structure, and a touch display device.

Description of Related Art

In the current structure of an electromagnetic touch panel, both a sensing circuit board and a shielding layer need to be supported by a substrate regardless of whether a film process or a printing process is adopted, and the sensing circuit board and the shielding layer are manually adhered together with an adhesive. Since both the sensing circuit board and the shielding layer need to be supported by a substrate, the structural thickness of the overall electromagnetic touch panel is limited thereby and cannot be effectively reduced. Furthermore, the process of manually adhering the sensing circuit board and the shielding layer is complicated and the labor cost is high. In addition, the main purpose of an adhesive layer is to adhere the sensing circuit board and the shielding layer, so the thickness of a normal adhesive layer is about several tens of micrometers. However, if the adhesive layer has to fill the offset thickness of the circuit, the adhesive layer needs to be thickened, otherwise bubbles or unevenness may occur. As a result, the structural thickness of the overall electromagnetic touch panel cannot be effectively reduced.

SUMMARY

The disclosure provides a touch structure with the advantage of thinning.

The disclosure further provides a manufacturing method of a touch structure for manufacturing the touch structure.

The disclosure also provides a touch display device, including the touch structure, which can meet the present trend of thinning.

The touch structure of the disclosure includes an insulating substrate, an electromagnetic shielding structure layer, a sensing circuit structure layer, a first insulating layer, and a second insulating layer. The electromagnetic shielding structure layer is disposed on the insulating substrate. The sensing circuit structure layer is disposed on the insulating substrate. The electromagnetic shielding structure layer is located between the insulating substrate and the sensing circuit structure layer, wherein the sensing circuit structure layer includes a first sensing circuit layer and a second sensing circuit layer. The first insulating layer is disposed between the electromagnetic shielding structure layer and the first sensing circuit layer. The second insulating layer is disposed between the first sensing circuit layer and the second sensing circuit layer.

In an embodiment of the disclosure, the electromagnetic shielding structure layer includes a metal shielding layer and a magnetic material layer. The metal shielding layer is in contact with the insulating substrate. The magnetic material layer is located between the metal shielding layer and the sensing circuit structure layer.

In an embodiment of the disclosure, the touch structure further includes a third insulating layer disposed on the second sensing circuit layer, wherein the second sensing circuit layer is located between the second insulating layer and the third insulating layer.

The manufacturing method of a touch structure according to the disclosure includes the following steps. A carrier is provided. An insulating substrate is formed on the carrier. A first coating procedure is performed to form an electromagnetic shielding structure layer on the insulating substrate. A first insulating layer is formed on the electromagnetic shielding structure layer. A second coating procedure is performed to form a first sensing circuit layer on the first insulating layer. A second insulating layer is formed on the first sensing circuit layer. A third coating procedure is performed to form a second sensing circuit layer on the second insulating layer. The carrier is removed.

In an embodiment of the disclosure, the method of forming the electromagnetic shielding structure layer includes forming a metal shielding layer in contact with the insulating substrate and forming a magnetic material layer on the metal shielding layer.

In an embodiment of the disclosure, after the third coating procedure is performed and before the carrier is removed, a third insulating layer is formed on the second sensing circuit layer.

In an embodiment of the disclosure, the step of removing the carrier includes performing a laser separation procedure to separate the insulating substrate and the carrier.

The touch display device of the disclosure includes a touch structure, a display film, a printed circuit board, and a flexible circuit board. The touch structure includes an insulating substrate, an electromagnetic shielding structure layer, a sensing circuit structure layer, a first insulating layer, and a second insulating layer. The electromagnetic shielding structure layer is disposed on the insulating substrate. The sensing circuit structure layer is disposed on the insulating substrate. The electromagnetic shielding structure layer is located between the insulating substrate and the sensing circuit structure layer, wherein the sensing circuit structure layer includes a first sensing circuit layer and a second sensing circuit layer. The first insulating layer is disposed between the electromagnetic shielding structure layer and the first sensing circuit layer. The second insulating layer is disposed between the first sensing circuit layer and the second sensing circuit layer. The display film is disposed on the sensing circuit structure layer, wherein the sensing circuit structure layer and the electromagnetic shielding structure layer are located between the display film and the insulating substrate. The printed circuit board is disposed on a surface of the insulating substrate. The flexible circuit board connects the second sensing circuit layer and the printed circuit board.

In an embodiment of the disclosure, the touch structure further includes a third insulating layer disposed on the second sensing circuit layer, wherein the second sensing circuit layer is located between the second insulating layer and the third insulating layer.

In an embodiment of the disclosure, the display film is an electrophoretic display film.

In an embodiment of the disclosure, the insulating substrate is an insulating flexible substrate.

Based on the above, in the design of the touch structure according to the disclosure, both the electromagnetic shielding structure layer and the sensing circuit structure layer are disposed on the same insulating substrate. As compared with the conventional sensing circuit layer and shielding layer, which need to be respectively supported by a substrate and are manually adhered together through an adhesive layer, the touch structure of the disclosure can have a thinner overall thickness and the labor cost can be significantly reduced. Furthermore, since both the electromagnetic shielding structure layer and the sensing circuit structure layer of the touch structure according to the disclosure are formed through coating procedures, the circuit width and thickness of the sensing circuit structure layer can be effectively reduced, and the electromagnetic shielding structure layer and the sensing circuit structure layer do not need to be adhered together using the adhesive layer. Therefore, the manufacturing method of the touch structure according to the disclosure allows the touch structure to have the advantage of thinning. In addition, the touch display device adopting the touch structure of the disclosure can have the advantages such as thinning and high resolution.

To make the aforementioned and other features of the disclosure more comprehensible, several embodiments accompanied with drawings are described in detail as follows.

DETAILED DESCRIPTION OF DISCLOSED EMBODIMENTS

Figure 1:
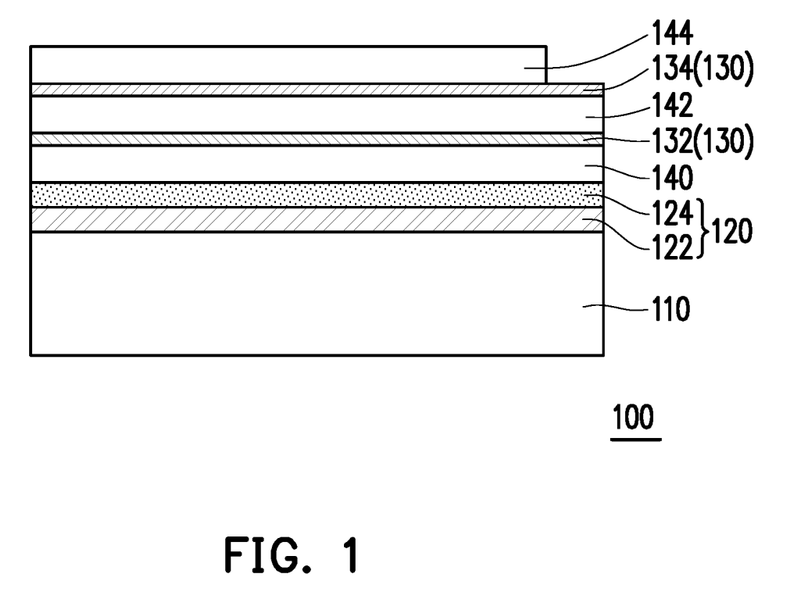
FIG. 1 is a cross-sectional schematic view of a touch structure according to an embodiment of the disclosure.

FIG. 1 is a cross-sectional schematic view of a touch structure according to an embodiment of the disclosure. Referring to FIG. 1, a touch structure 100 of the embodiment includes an insulating substrate 110, an electromagnetic shielding structure layer 120, a sensing circuit structure layer 130, a first insulating layer 140, and a second insulating layer 142. Here, the insulating substrate 110 is, for example, an insulating flexible substrate, and the material thereof is, for example, polyimide (PI), poly(ethylene naphthalate) (PEN), or other suitable material.

The electromagnetic shielding structure layer 120 is disposed on the insulating substrate 110 to isolate the electromagnetic interference from the host system. The electromagnetic shielding structure layer 120 may include a metal shielding layer 122 and a magnetic material layer 124, wherein the metal shielding layer 122 is in direct contact with the insulating substrate 110, and the magnetic material layer 124 is disposed on the metal shielding layer 122 and located between the metal shielding layer 122 and the sensing circuit structure layer 130. Here, the material of the metal shielding layer 122 may be aluminum or other suitable material and the material of the magnetic material layer 124 may be a ferrite compound or other magnetic absorbing material.

The sensing circuit structure layer 130 is disposed on the insulating substrate 110, and the electromagnetic shielding structure layer 120 is located between the insulating substrate 110 and the sensing circuit structure layer 130. The sensing circuit structure layer 130 includes a first sensing circuit layer 132 and a second sensing circuit layer 134. More specifically, the sensing circuit structure layer 130 of the embodiment may sense a change in magnetic flux and sends to the host system for computation to define a location point. In other words, the touch structure 100 of the embodiment is embodied as an electromagnetic touch panel. For example, when the first sensing circuit layer 132 may be, for example, a sensing circuit in the X-axis direction, the second sensing circuit layer 134 may be, for example, a sensing circuit in the Y-axis direction, but are not limited thereto. In addition, the material of the first sensing circuit layer 132 and the second sensing circuit layer 134 is, for example, copper or other suitable material.

The first insulating layer 140 is disposed between the electromagnetic shielding structure layer 120 and the first sensing circuit layer 132 to insulate the magnetic material layer 124 and the first sensing circuit layer 132. The second insulating layer 142 is disposed between the first sensing circuit layer 132 and the second sensing circuit layer 134 to insulate the first sensing circuit layer 132 and the second sensing circuit layer 134. Here, the material of the first insulating layer 140 and the second insulating layer 142 may be an inorganic insulating material such as tantalum nitride or tantalum oxide, or an insulating material such as acrylic resin. In addition, optionally, the touch structure 100 of the embodiment may further include a third insulating layer 144 disposed on the second sensing circuit layer 134 to insulate the outside and the second sensing circuit layer 134. That is, the second sensing circuit layer 134 is located between the second insulating layer 142 and the third insulating layer 144.

In short, in the design of the touch structure 100 according to the embodiment, both the electromagnetic shielding structure layer 120 and the sensing circuit structure layer 130 are disposed on the same insulating substrate 110. As compared with the conventional sensing circuit layer and shielding layer, which need to be respectively supported by a substrate and are manually adhered together through an adhesive layer, the touch structure 100 of the disclosure can reduce the thickness of at least one substrate, and the adhesive layer and labor are not needed, so as to have a thinner overall thickness and the labor cost can be significantly reduced.

In order to illustrate the formation of the touch structure 100 in detail, the manufacturing method of the touch structure 100 will be illustrated below with reference to FIG. 2A to FIG. 2F.

FIG. 2A to FIG. 2F are cross-sectional schematic views of a manufacturing method of a touch structure according to an embodiment of the disclosure. First, referring to FIG. 2A, a carrier 150 is provided. Here, the carrier 150 is, for example, a temporary carrier substrate, and the material thereof is, for example, plastic, glass, etc., but is not limited thereto, wherein the carrier 150 has a supporting effect and a flat surface characteristic.

Next, referring to FIG. 2A again, an insulating substrate 110 is formed on the carrier 150 by coating or attaching a film. Here, the insulating substrate 110 is a flexible substrate which may be placed in a high temperature and vacuum chamber, and the material thereof is, for example, PI, PEN, or other suitable material. In a preferred embodiment, the thickness of the insulating substrate 110 is, for example, 10 micrometers, but the disclosure is not limited thereto.

Figure 2A:
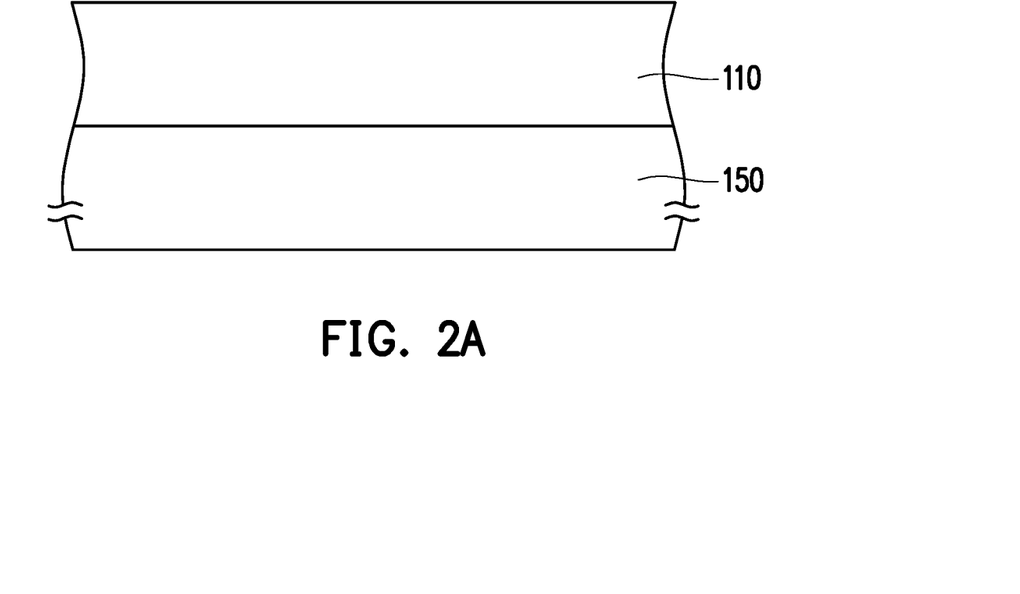
FIG. 2A to FIG. 2F are cross-sectional schematic views of a manufacturing method of a touch structure according to an embodiment of the disclosure.
Figure 2B:
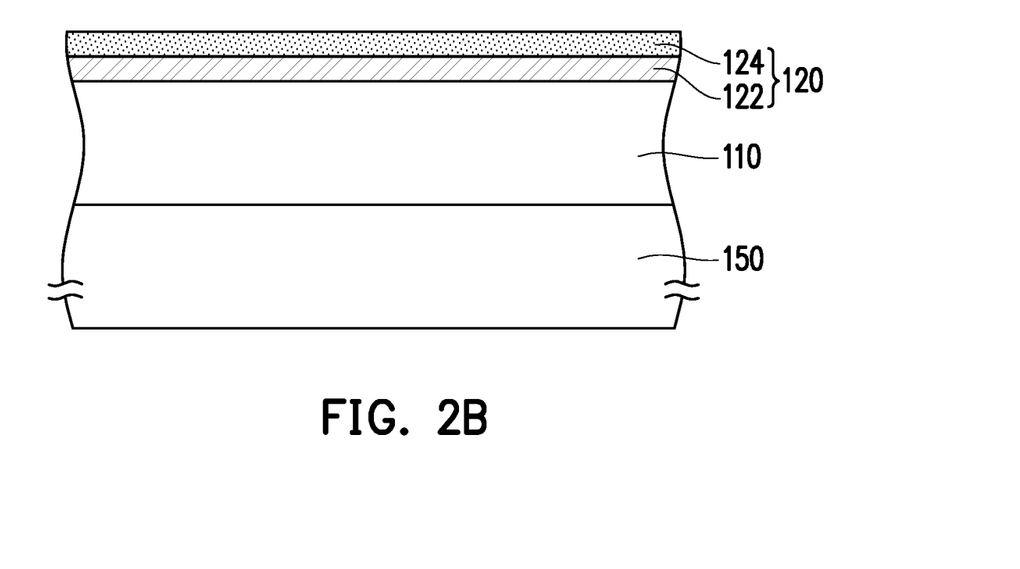

Next, referring to FIG. 2B, a first coating procedure is performed to form an electromagnetic shielding structure layer 120 on the insulating substrate 110. It is illustrated first that the coating procedure here may be a physical vapor deposition (PVD), such as evaporation or sputtering. Specifically, in this step, a metal shielding layer 122 is first formed on the insulating substrate 110, wherein the metal shielding layer 122 is in direct contact with the insulating substrate 110. Next, a magnetic material layer 124 is formed on the metal shielding layer 122, wherein the metal shielding layer 122 is located between the magnetic material layer 124 and the insulating substrate 110. So far, the manufacture of the electromagnetic shielding structure layer 120 has been completed.

Since the embodiment allows the magnetic material layer 124 with a magnetic absorbing material to be directly deposited on the metal shielding layer 122 by the coating procedure, the conventional procedure of coating an aluminum film on the substrate first before adhering the magnetic absorbing material is effectively simplified and the adhesive layer is not needed between the magnetic material layer 124 and the metal shielding layer 122. In a preferred embodiment, the thickness of the metal shielding layer 122 is, for example, 2 micrometers and the thickness of the magnetic material layer 124 is, for example, 2 micrometers, but the disclosure is not limited thereto.

Figure 2C:
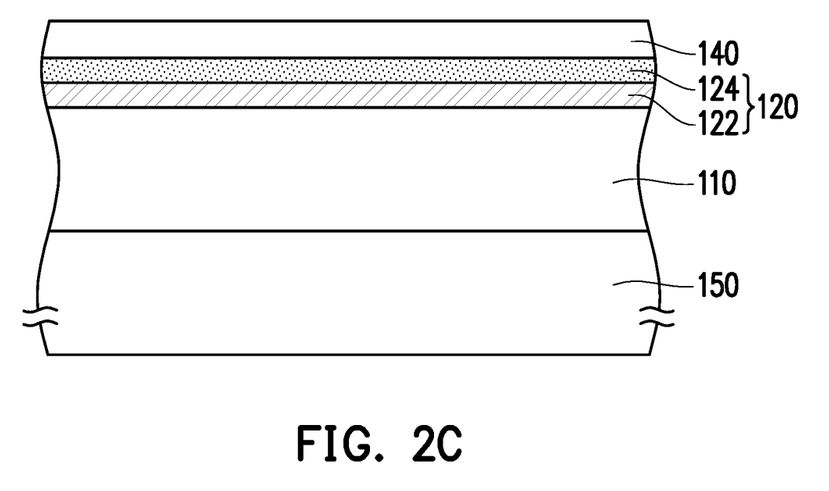

Next, referring to FIG. 2C, a first insulating layer 140 is formed on the electromagnetic shielding structure layer 120, wherein the first insulating layer 140 covers the magnetic material layer 124 of the electromagnetic shielding structure layer 120. In a preferred embodiment, the thickness of the first insulating layer 140 is, for example, 3 micrometers.

Figure 2D:
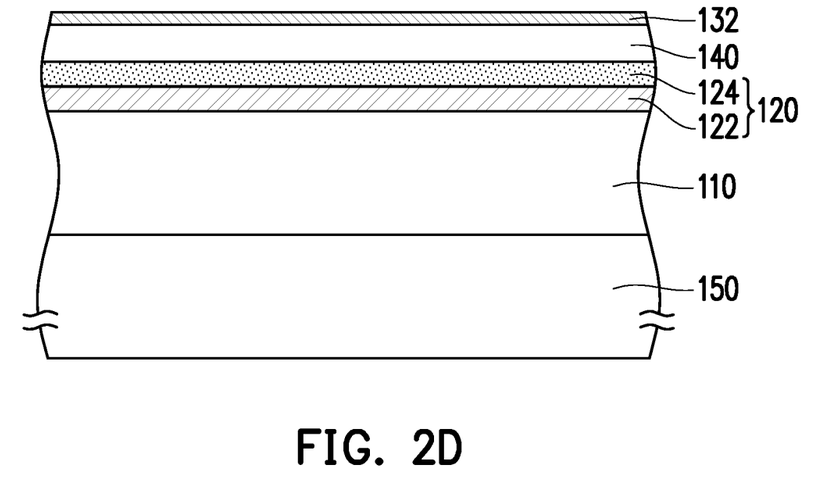

Next, referring to FIG. 2D, a second coating procedure is performed to form a first sensing circuit layer 132 on the first insulating layer 140. In detail, after a conductive film is first formed on the first insulating layer 140 by a coating procedure, a sensing circuit is formed by a photolithography process. The etching here may be dry etching or wet etching. Since the first sensing circuit layer 132 is formed by the coating procedure, the thickness of the first sensing circuit layer may be, for example, between 0.1 micrometers and 3 micrometers. In a preferred embodiment, the thickness of the first sensing circuit layer 132 is 1 micrometer.

Figure 2E:
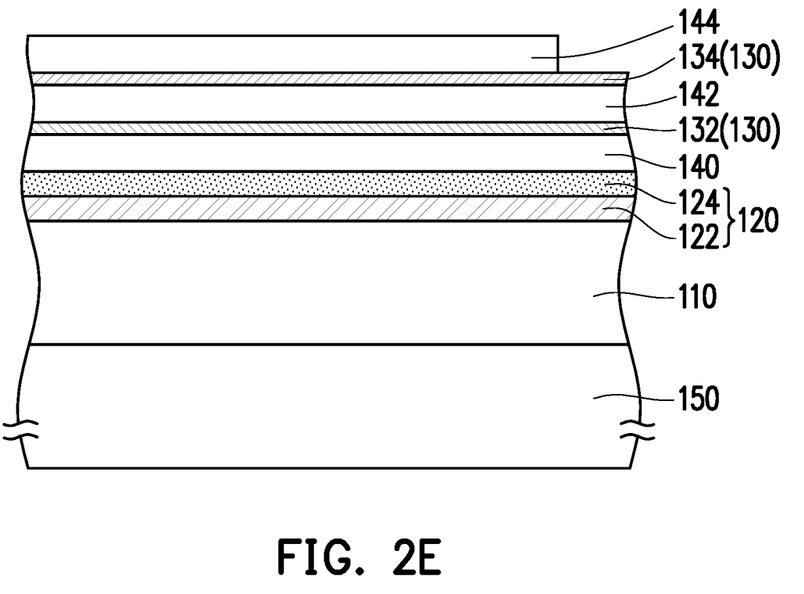

Thereafter, referring to FIG. 2E, a second insulating layer 142 is formed on the first sensing circuit layer 132, wherein the second insulating layer 142 covers the first sensing circuit layer 132. In a preferred embodiment, the thickness of the second insulating layer 142 is, for example, 3 micrometers.

Next, referring to FIG. 2E again, a third coating procedure is performed to form a second sensing circuit layer 134 on the second insulating layer 142. Specifically, after a conductive film is first formed on the second insulating layer 142 by the coating procedure, a patterned second sensing circuit layer 134 is formed by a photolithography process and a connection port (not shown) is manufactured. The connection port is a channel for electrically connecting the first sensing circuit layer 132 and the second sensing circuit layer 134. In a preferred embodiment, the thickness of the second sensing circuit layer 134 is 1 micrometer. Here, the first sensing circuit layer 132 and the second sensing circuit layer 134 may define the sensing circuit structure layer 130.

Referring to FIG. 2E again, optionally, a third insulating layer 144 may be formed on the second sensing circuit layer 134 as a protective film for the second sensing circuit layer 134. In a preferred embodiment, the thickness of the third insulating layer 144 is, for example, 3 micrometers.

Figure 2F:
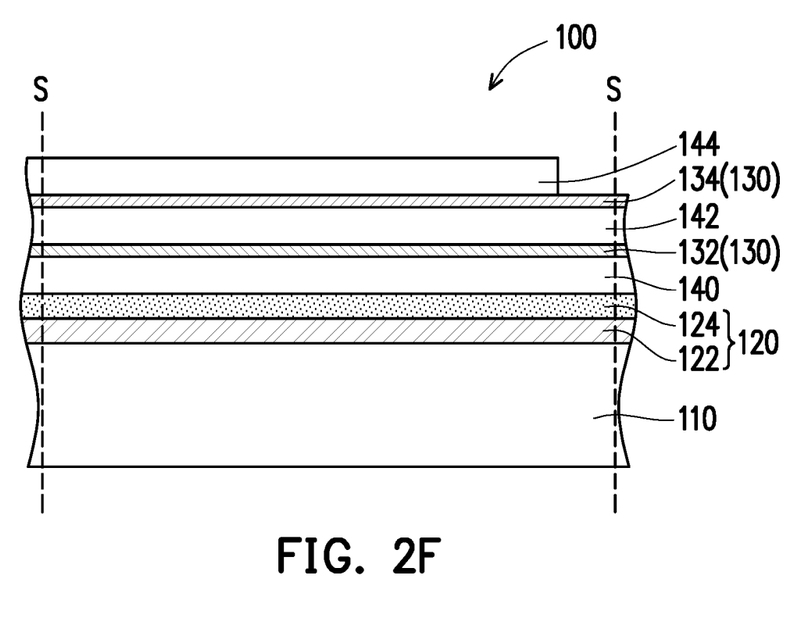

Finally, referring to FIG. 2F, a carrier 150 is removed and a singulation process is performed by laser cutting or mechanical separation technique to form at least one touch structure 100. Here, the singulation process may cut the third insulating layer 144, the second sensing circuit layer 134, the second insulating layer 142, the first sensing circuit layer 132, the first insulating layer 140, the electromagnetic shielding structure layer 120, and the insulating substrate 110 along a cutting line S through a technique of mechanical cutting or laser cutting to form the touch structure 100. So far, the manufacture of the touch structure 100 has been completed.

In another unshown embodiment, in a manufacturing method of a touch structure, please refer to FIG. 2A again, before forming the insulating substrate 110 on the carrier 150, a release material may be formed on the carrier 150 by coating or attaching a film. Then, please refer to FIG. 2E again, after performing a third coating procedure, the release material is peeled off to separate the insulating substrate 110 and the carrier 150, and the carrier 150 is removed. And then, please refer to FIG. 2F, the touch structure is formed according to the steps described in the previous embodiment. As such, the insulating substrate 110 parting from the carrier 150 is facilitated without cutting.

In short, since both the electromagnetic shielding structure layer 120 and the sensing circuit structure layer 130 of the touch structure 100 according to the embodiment are formed by the coating procedure, the circuit width and thickness of the sensing circuit structure layer 130 can be effectively reduced, and the electromagnetic shielding structure layer 120 and the sensing circuit structure layer 130 do not need to be adhered together using the adhesive layer. Therefore, the manufacturing method of the touch structure 100 according to the embodiment can effectively reduce the thickness of the touch structure 100, simplify the process, and reduce the cost. Moreover, as compared to the circuit width of 50 micrometers of current printed circuit board, the boundary of the touch structure 100 according to the embodiment is reduced and the density of the sensing circuit structure layer 130 is improved, thereby improving precision and resolution. In a preferred embodiment, the sensing circuit structure layer 130 may increase the resolution by a factor of 2 or more. On the other hand, since the embodiment may form the at least one touch structure 100 through the singulation process, the production efficiency can be improved and large sizes can be easily produced.

Figure 3:
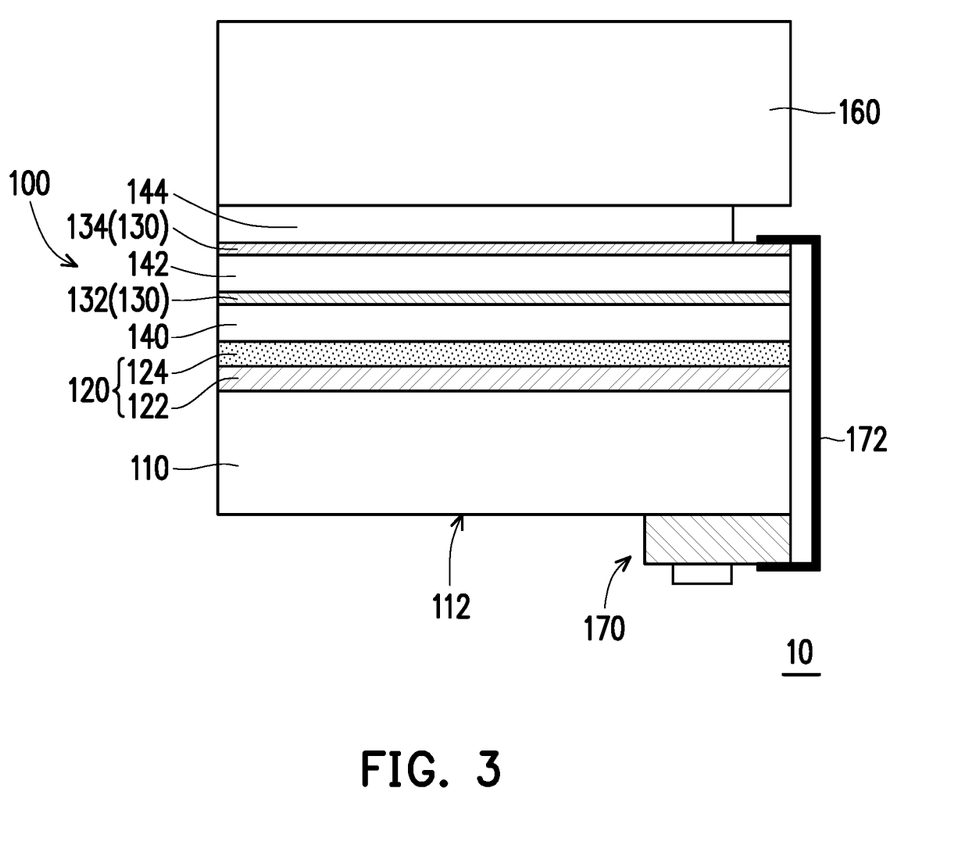
FIG. 3 is a cross-sectional schematic view of a touch display device according to an embodiment of the disclosure.

FIG. 3 is a cross-sectional schematic view of a touch display device according to an embodiment of the disclosure. Referring to FIG. 3, a touch display device 10 of the embodiment includes a touch structure 100, a display film 160, a printed circuit board 170, and a flexible circuit board 172. The display film 160 is disposed on a sensing circuit structure layer 130, wherein the sensing circuit structure layer 130 and the electromagnetic shielding structure layer 120 are located between the display film 160 and the insulating substrate 110. Here, the display film 160 may be an electrophoretic display film, such as a microcapsule display film, a microcup display film, or other suitable display film, and is not limited thereto. The printed circuit board 170 is disposed on a surface 112 of the insulating substrate 110 opposite to the electromagnetic shielding structure layer 120, and the flexible circuit board 172 is connected to the second sensing circuit layer 134 and the printed circuit board 170.

Since the touch display device 10 of the embodiment includes the touch structure 100, the touch display device 10 can have the advantages of thinning, large size, and high resolution.

Based on the above, in the design of the touch structure according to the disclosure, both the electromagnetic shielding structure layer and the sensing circuit structure layer are disposed on the same insulating substrate. As compared with the conventional sensing circuit layer and shielding layer, which need to be respectively supported by a substrate and are manually adhered together through an adhesive layer, the touch structure of the disclosure can have a thinner overall thickness and the labor cost can be significantly reduced. Furthermore, since both the electromagnetic shielding structure layer and the sensing circuit structure layer of the touch structure according to the disclosure are formed through coating procedures, the circuit width and thickness of the sensing circuit structure layer can be effectively reduced, and the electromagnetic shielding structure layer and the sensing circuit structure layer do not need to be adhered together using the adhesive layer. Therefore, the manufacturing method of the touch structure according to the disclosure allows the touch structure to have the advantage of thinning. In addition, the touch display device adopting the touch structure of the disclosure can have the advantages such as thinning and high resolution.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A touch structure, comprising:
   an insulating substrate;
   an electromagnetic shielding structure layer disposed on the insulating substrate;
   a sensing circuit structure layer disposed on the insulating substrate, the electromagnetic shielding structure layer is located between the insulating substrate and the sensing circuit structure layer, wherein the sensing circuit structure layer comprises a first sensing circuit layer and a second sensing circuit layer;
   a first insulating layer disposed between the electromagnetic shielding structure layer and the first sensing circuit layer; and
   a second insulating layer disposed between the first sensing circuit layer and the second sensing circuit layer,
   wherein the electromagnetic shielding structure layer comprises:
   a metal shielding layer in contact with the insulating substrate; and
   a magnetic material layer located between the metal shielding layer and the sensing circuit structure layer.

2. The touch structure according to claim 1, further comprising:
   a third insulating layer disposed on the second sensing circuit layer, wherein the second sensing circuit layer is located between the second insulating layer and the third insulating layer.

3. A touch display device, comprising:
   a touch structure, comprising:
   an insulating substrate;
   an electromagnetic shielding structure layer disposed on the insulating substrate;
   a sensing circuit structure layer disposed on the insulating substrate, the electromagnetic shielding structure layer is located between the insulating substrate and the sensing circuit structure layer, wherein the sensing circuit structure layer comprises a first sensing circuit layer and a second sensing circuit layer;
   a first insulating layer disposed between the electromagnetic shielding structure layer and the first sensing circuit layer; and
   a second insulating layer disposed between the first sensing circuit layer and the second sensing circuit layer,
   wherein the electromagnetic shielding structure layer comprises:
   a metal shielding layer in contact with the insulating substrate; and
   a magnetic material layer located between the metal shielding layer and the sensing circuit structure layer;
   a display film disposed on the sensing circuit structure layer, wherein the sensing circuit structure layer and the electromagnetic shielding structure layer are located between the display film and the insulating substrate;
   a printed circuit board disposed on a surface of the insulating substrate; and
   a flexible circuit board connecting the second sensing circuit layer and the printed circuit board.

4. The touch display device according to claim 3, wherein the touch structure further comprises:
   a third insulating layer disposed on the second sensing circuit layer, wherein the second sensing circuit layer is located between the second insulating layer and the third insulating layer.

5. The touch display device according to claim 3, wherein the display film is an electrophoretic display film.

6. The touch display device according to claim 3, wherein the insulating substrate is an insulating flexible substrate.

* * * * *